United States Patent
Albers et al.

(10) Patent No.: US 7,074,628 B2
(45) Date of Patent: Jul. 11, 2006

(54) TEST STRUCTURE AND METHOD FOR YIELD IMPROVEMENT OF DOUBLE POLY BIPOLAR DEVICE

(75) Inventors: Bradley J. Albers, Dallas, TX (US); Thomas Craig Esry, Orlando, FL (US); Daniel Charles Kerr, Orlando, FL (US); Edward Paul Martin, Jr., Orlando, FL (US); Oliver Desmond Patterson, Poughkeepsie, NY (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/947,069

(22) Filed: Sep. 22, 2004

(65) Prior Publication Data

US 2006/0063282 A1  Mar. 23, 2006

(51) Int. Cl.
*H01L 31/26* (2006.01)
*H01L 21/66* (2006.01)

(52) U.S. Cl. .............................. 438/14; 438/38; 438/60

(58) Field of Classification Search .................. 438/14, 438/17, 28, 38, 60, 61
See application file for complete search history.

(56) References Cited

U.S. PATENT DOCUMENTS

| | | | |
|---|---|---|---|
| 3,688,164 A | * | 8/1972 | Tsukuda et al. ............ 257/163 |
| 5,406,116 A | | 4/1995 | Wills et al. |
| 5,751,022 A | * | 5/1998 | Yasuhara et al. ........... 257/133 |
| 6,091,249 A | | 7/2000 | Talbot et al. |
| 6,201,240 B1 | | 3/2001 | Dotan et al. |
| 6,236,222 B1 | | 5/2001 | Sur, Jr. et al. |
| 6,448,099 B1 | | 9/2002 | Iacoponi et al. |
| 6,504,393 B1 | | 1/2003 | Lo et al. |
| 6,628,001 B1 | | 9/2003 | Chittipeddi et al. |
| 6,664,797 B1 | | 12/2003 | Wollesen |
| 6,747,445 B1 | | 6/2004 | Fetterman et al. |
| 6,780,724 B1 | | 8/2004 | Terpstra et al. |

* cited by examiner

*Primary Examiner*—Phuc T. Dang

(57) ABSTRACT

A method and apparatus for identifying crystal defects in emitter-base junctions of NPN bipolar transistors uses a test structure having an NP junction that can be inspected using passive voltage contrast. The test structure eliminates the collector of the transistor and simulates only the emitter and base. Eliminating the collector removes an NP junction between collector and substrate of a wafer allowing charge to flow from the substrate to emitter if the emitter-base junction is defective since only one NP junction exists in the test structure. In one embodiment, the test structures are located between dies on a wafer and may be formed in groups of several thousand.

6 Claims, 2 Drawing Sheets

P-TYPE SUBSTRATE

TEST STRUCTURE AND METHOD FOR YIELD IMPROVEMENT OF DOUBLE POLY BIPOLAR DEVICE

BACKGROUND OF THE INVENTION

The present invention relates to detection of semiconductor device defects and, more particularly, to detection of crystal lattice defects during formation of NPN transistor devices on semiconductor integrated circuit dies of a semiconductor wafer.

Electron beam voltage contrast testing for open and shorted conductors on integrated circuit devices in semiconductor wafers is based on the principle that circuit voltage can be determined by measuring the intensity of secondary electron emission. Typically, an electron beam of low voltage is directed onto a device surface while an electron detector is positioned to collect secondary emitted electrons. Open circuit conductor or nodes will charge to a positive voltage and reduce the intensity of secondary electron emission while short circuit nodes will not charge and will have a higher secondary electron emission. An image of the area of inspection will have brighter spots for open-circuit or isolated nodes and darker spots for shorted nodes.

The present invention is directed to use of passive voltage contrast (PVC) inspection for NPN bipolar transistor structures in integrated circuits. Current manufacturing yield of double polycrystalline silicon (poly) NPN bipolar transistor structure with epitaxial base is dependent on crystal lattice quality. Defects in the epitaxial base create device failures. It is extremely difficult to locate crystal defects using current analytical techniques so that cross-sections of defect areas can be prepared to determine a cause of such defects.

Application of PVC inspection to large scale and ultra large scale integrated circuits has a number of problems. For the common NPN bipolar transistor structure, defects at the emitter-base NP junction are not detectable since the underlying collector-substrate NP junction allows charge to accumulate in the collector and to produce a false positive indication of no defects. Further, the size and density of such devices makes most types of inspection and test procedures impractical.

DETAILED DESCRIPTION OF THE INVENTION

Figure 1A:
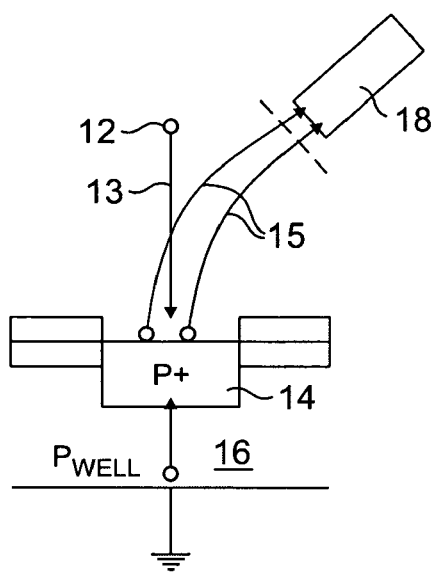
FIG. 1A is a simplified block diagram of a PVC inspection system in which the radiated device does not charge.
Figure 1B:
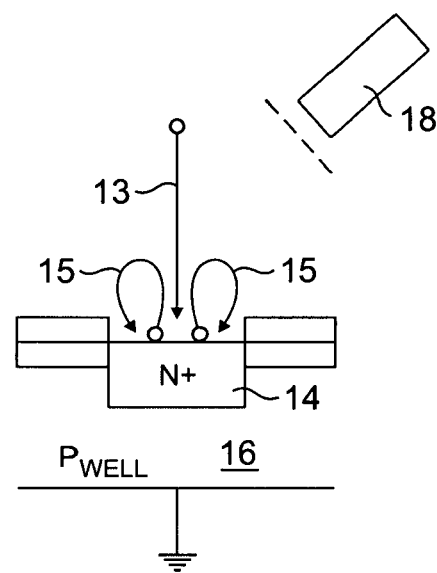
FIG. 1B is a diagram corresponding to FIG. 1A in which the radiated device is charged by the electron beam.

Referring now to the drawings in general and in particular to FIGS. 1A and 1B, there is shown a generalized representation of a passive voltage contrast (PVC) inspection system for examining semiconductor devices. In FIG. 1A, an electron beam source 12 directs a stream of electrons 13 onto an element 14 of P-type material that resides on a substrate 16 or Pwell of P-type material. Since the P-type material of the underlying P-type substrate 16 can supply a plentiful number of electrons to the P-type element 14, significant secondary electrons indicated by arrows 15 are emitted from the element 14 and are detected by detector 18. As a result, the detector 18 produces an output signal that creates a bright image of the P-type element 14. In other words, there is no impediment to transfer of electrons from substrate 16 to element 14. In FIG. 1B, the element 14 is now doped to be an N-type material so that there is in effect a reverse biased NP junction between the element 14 and substrate 16. Consequently, the N-type material of element 14 becomes charged by the impinging electrons from the source 12. The charge on element 14 attracts secondary electrons emitted by element 14 and reduces the number of electrons that are emitted with sufficient energy to reach the detector 18. Consequently, imaging of the N-type material of element 14 produces a darker image than the P-type material of FIG. 1A.

In the example of FIG. 1B, if there is a crystal lattice problem that exists in the N-type material of element 14 so that the NP junction is ineffective to prevent the flow of electrons from the P-type substrate 16 into the N-type material, a charge will not be accumulated on the N-type material element 14 and the image created by the detector 18 will have the same characteristics as FIG. 1A, i.e., the image will appear bright. This obviously occurs because the P-type substrate 16 supplies electrons to the N-type material of element 14 and prevents charge or positive voltage build up on the N-type. More precisely, the charging produces a local electric field which influences the secondary electron yield and produces a voltage contrast image. Bright areas indicate that many electrons are being emitted which means there is a plentiful supply of electrons, generally from the underlying substrate. Dark areas have fewer electrons emitted indicating that the secondary electrons are attracted back to the surface area of the element 14 by the local field because there is not a plentiful supply of electrons to be emitted to prevent the area from becoming charged.

In the examples of FIGS. 1A and 1B, there is only a single junction which exists between the elements 14 and the underlying substrate 16. However, transistor structures are basically three layer devices. In a typical NPN type transistor structure, the structure includes an N-type emitter overlaying a thin base region formed of a P-type material which in turn overlays a larger collector structure comprising an N-type material. The inspection of such NPN type transistor structures is designed to detect defects existing in the thin base region between the emitter and collector.

Figure 2:
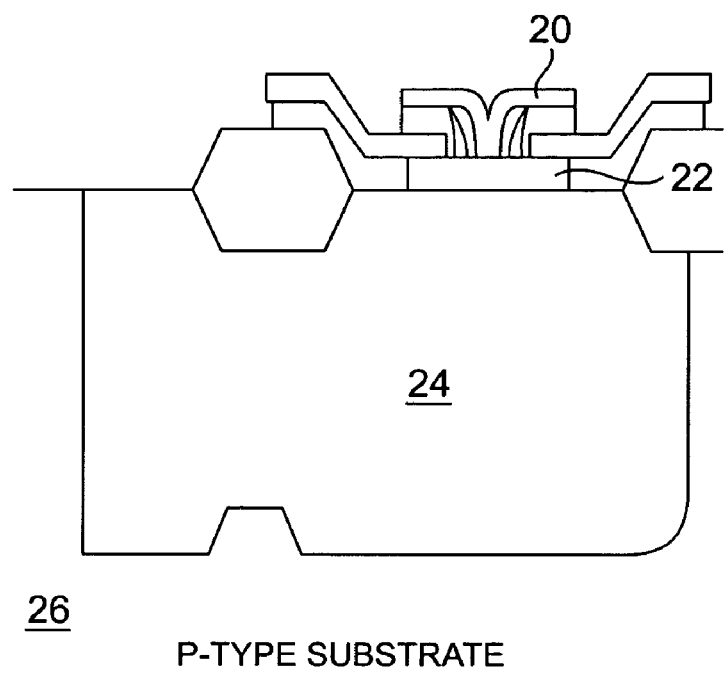
FIG. 2 is a cross-sectional view of one form of double-poly NPN transistor.

Referring to FIG. 2, there is shown a simplified cross-sectional representation of an NPN type transistor structure in which it is desired to determine whether there are defects between the N-type emitter 20 and the P-type base 22 at the base-emitter interface. When PVC is used to inspect the structure of FIG. 2, if there are no defects that would cause a shorted condition from the emitter 20 through the base 22 to the collector 24, the image will appear dark since charge will accumulate on the N-type emitter 20 and result in secondary electrons being attracted back to the surface as described above with respect to FIG. 1B. However, if there is a crystal lattice defect that allows conduction between the N-type emitter 20 and P-type base 22, any charge that accumulates on the emitter and base will forward bias the PN junction between the base and collector 24 which then allows the N-type collector 24 to charge, i.e., the N-type collector 24 overlies a P-type substrate 26 creating an NP junction between the collector and the substrate that will be reverse biased allowing charge to accumulate in the collector, base and emitter. The net effect is that the emitter structure 20 will still become charged and will appear as a dark image on the detector 18. Consequently, passive voltage contrast inspection would not produce an indication of an emitter base failure in the NPN transistor on a P-type substrate.

Figure 1C:
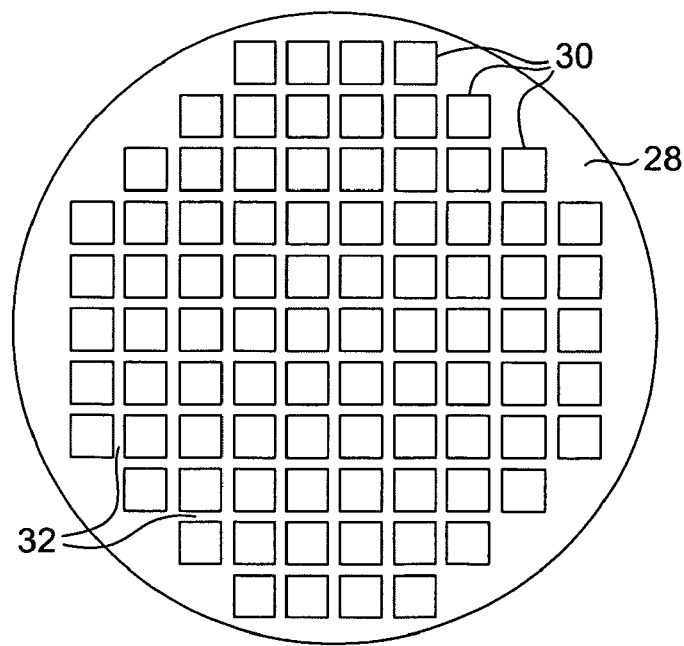
FIG. 1C is a top plan view of a semiconductor wafer.

Applicants have conceived a test circuit which enables examination of emitter base structures of the transistors by placing test circuits in the spaces between adjacent dies on a semiconductor wafer. The test circuits are positioned solely for test purposes and not part of any of the integrated circuit on any of the dies. Referring briefly to FIG. 1C, there is shown an exemplary form of a wafer 28 having a plurality of dies 30 separated by spaces 32. The wafer 24 comprises a generally circular, flat disk of crystalline structure, typically of silicon but sometimes of other material such as gallium arsenide or germanium, and may be doped to create either an N-type or P-type material. In the illustrative example of FIG. 1A, the wafer is doped to produce a P-type material and the N-type collector is formed in the P-type material by implant and diffusion of N-type material into the substrate at desired locations of NPN transistors.

Figure 3:
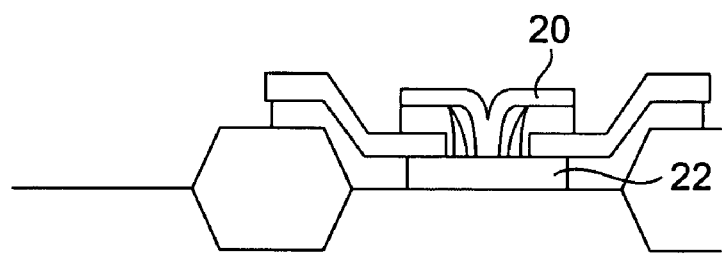
FIG. 3 is a cross-sectional view of a test circuit for detecting crystal lattice defects.

FIG. 3 illustrates a preferred form of transistor test circuit for use with PVC inspection. FIG. 3 shows a transistor structure substantially identical to the structure of FIG. 2 except that the N-type material of collector 24 has been omitted so that the P-type material extends up from the P-type base to the P-type substrate. The physical appearance of the transistor at the emitter-base layers is the same but the characteristics are now simply an NP diode type structure. Eliminating the N-type collector can be done by masking the spaces between the dies during the time in which N-type doping of selected regions of the substrate is being performed to create N-type collectors. Other well known methods of creating a P-type "collector" could be used, including implanting a CMOS Pwell into this structure. As a consequence, a test "transistor" structure or semiconductor structure is formed having P-type material extending from the P-type substrate up to the P-type base. In this form, if there is a crystal lattice defect or shorted condition between the N-type emitter 20 and the P-type base 22, the imaging of the N-type emitter by the electron beam will result in a bright image since the NP junction between the collector and substrate in the structure has been eliminated to allow electrons to migrate up to the N-type emitter and therefore preclude it from being charged.

In a preferred embodiment, an array of thousands of the transistor structures of FIG. 3 may be created in a space 32 between adjacent dies 30 on wafer 28. PVC inspection can then be done by simply scanning across these thousands of structures and looking for bright spots indicative of a crystal lattice problem between the base and emitter of any of the structures, i.e., test circuits having defects will appear bright as compared to other circuits in the array. When the crystal structures formed during the epitaxial growth process have defects, short circuit conditions may exist between the emitter and the thin base layer. The present invention thus provides a way for inspecting the system for defects which result in short circuit conditions between the emitter and base junctions.

The present invention allows for rapid detection and classification of defects which are generally difficult to find. Further, the present invention can be used in line to detect defects immediately after transistor formation and enable rapid changing of a process to correct the cause of defects. Further, the test circuits can be built using the standard process flow and can therefore be used on any wafer without having to interrupt the production process.

The invention claimed is:

1. A method of detecting crystal lattice defects in semiconductor manufacturing wherein a plurality of double-poly NPN transistors are formed in each of a plurality of spaced dies on a semiconductor wafer having a P-type substrate, comprising:
    forming test circuits on the wafer, the test circuit comprising a plurality of semiconductor structures having an N-type emitter structure overlaying a P-type base structure overlaying P-type material integrated with the wafer substrate;
    charging the test circuits with an electron beam;
    detecting secondary electrons emitted from the N-type emitter of the semiconductor structures; and
    identifying test circuits exhibiting crystal lattice detects as a function of secondary electron emission.

2. The method of claim 1 and including crystal structure analysis of identified devices to determine manufacturing process adjustments.

3. The method of claim 1 wherein the semiconductor structures are formed concurrently with formation of transistors in the dies.

4. The method of claim 1 wherein the steps of charging, detecting and identifying comprise passive voltage contrast measurement.

5. The method of claim 1 wherein the test circuits are located in spaces between dies.

6. The method of claim 1 wherein the step of identifying comprises identifying circuits having a bright appearance indicative of significant secondary electron emission.

* * * * *